United States Patent [19]

Murari et al.

[11] 4,455,585
[45] Jun. 19, 1984

[54] CAR ALTERNATOR ELECTRIC POWER GENERATOR PROTECTED AGAINST TRANSIENTS DUE TO BATTERY DISCONNECTION

[75] Inventors: Bruno Murari, Monza; Sandro Storti, Sesto San Giovanni; Marco Morelli, Leghorn; Carlo Bozotti, Binasco, all of Italy

[73] Assignee: SGS-ATES Componenti Elettronici S.p.A., Milan, Italy

[21] Appl. No.: 316,907

[22] Filed: Oct. 30, 1981

[30] Foreign Application Priority Data

Nov. 7, 1980 [IT] Italy .............................. 25825 A/80

[51] Int. Cl.$^3$ ............................................. H02H 7/20
[52] U.S. Cl. ....................................... 361/18; 361/56; 361/91; 361/111; 361/21; 322/28; 322/68
[58] Field of Search ................... 361/21, 20, 35, 40, 361/38, 91, 56, 18, 110, 111; 322/28, 25, 68, 59, 71, 72

[56] References Cited

U.S. PATENT DOCUMENTS

| | | | |
|---|---|---|---|
| 3,713,016 | 1/1973 | Lehnhoff | 322/28 |
| 4,155,107 | 5/1979 | Osborne et al. | 361/21 X |
| 4,156,172 | 5/1979 | Hucker et al. | 361/21 X |
| 4,280,161 | 7/1981 | Kuhn et al. | 361/56 X |

FOREIGN PATENT DOCUMENTS 2716206 10/1978 Fed. Rep. of Germany ........ 361/20

OTHER PUBLICATIONS

"Electricity in Cars", R. H. Bacon, Philips Technical Library, 1967.

Primary Examiner—Patrick R. Salce
Attorney, Agent, or Firm—Wenderoth, Lind & Ponack

[57] ABSTRACT

An electric power generator which includes a component, for example, a Zener diode, connected in series with the usual return diode which is connected in parallel to the excitation winding of the alternator. The Zener diode makes it possible to set the discharging voltage due to the energy stored in the magnetic field associated with the inductance of the excitation winding at a relatively high level during high-voltage transients caused by the accidental disconnection of the wire connecting the alternator to a load or a terminal of the motor vehicle battery while it is in the charging stage. The result is a more rapid dissipation of the energy stored in the excitation circuit, and therefore results in an output transient having a reduced energy content. Thus, it is possible to construct a voltage regulator and such other devices as may be powered by the alternator in the form of low-voltage integrated circuits.

2 Claims, 4 Drawing Figures

CAR ALTERNATOR ELECTRIC POWER GENERATOR PROTECTED AGAINST TRANSIENTS DUE TO BATTERY DISCONNECTION

BACKGROUND OF THE INVENTION

TEXT OF THE DESCRIPTION

The present invention concerns electric power generators for motor vehicles and, more specifically, to an alternator generator having an electronic regulator.

It is known that the voltage regulator of an alternator senses the output voltage of the alternator and acts upon the excitation current of the alternator in order to maintain the output voltage within predetermined limits. Overvoltage conditions, however, may occur, under which not only is the regulator ineffective, but may itself be damaged, such as, for example, in the case of the accidental disconnection or breaking of the cable connecting the alternator to the load consisting of the motor vehicle battery and other electric or electronic devices. In order to avoid damage, which is particularly likely if the regulator is constructed as an integrated circuit, it is necessary to apply appropriate limiting devices to the output of the alternator and/or to resort to manufacturing technology used for high-voltage integrated circuits. A less serious condition in absolute terms, but more dangerous because it also affects the devices and circuits powered by the generator, may occur when the battery connection is accidentally disconnected, while the other loads remain connected to the alternator. The reason is that, if the battery was being charged a moment before the disconnection thereof, and therefore the current absorbed by it was considerable, the overvoltage may be sufficiently high to damage some device powered by the alternator. In order to avoid this risk as well, if a limiting device of adequate power is not already provided for the output of the alternator, it is necessary to protect each device individually. Specifically, if said devices are built as integrated circuits, often it is necessary again to resort to overvoltage-resistant structures.

SUMMARY OF THE INVENTION

The purpose of the present invention is to build an alternator generator which makes it possible to use, both for the regulator and for other electronic devices pwoered by the generator, integrated circuits manufactured according to the usual processes for low-voltage structures.

Said purpose is achieved according to the present invention by means of a power generator of the type described and characterized in the attached claims.

BRIEF DESCRIPTION OF THE DRAWINGS

The invention will be better described in detail below by means of an embodiment shown as an example, and therefore not limiting its scope, with reference to the attached drawings, wherein.

DESCRIPTION OF THE PREFERRED EMBODIMENTS

Figure 1:
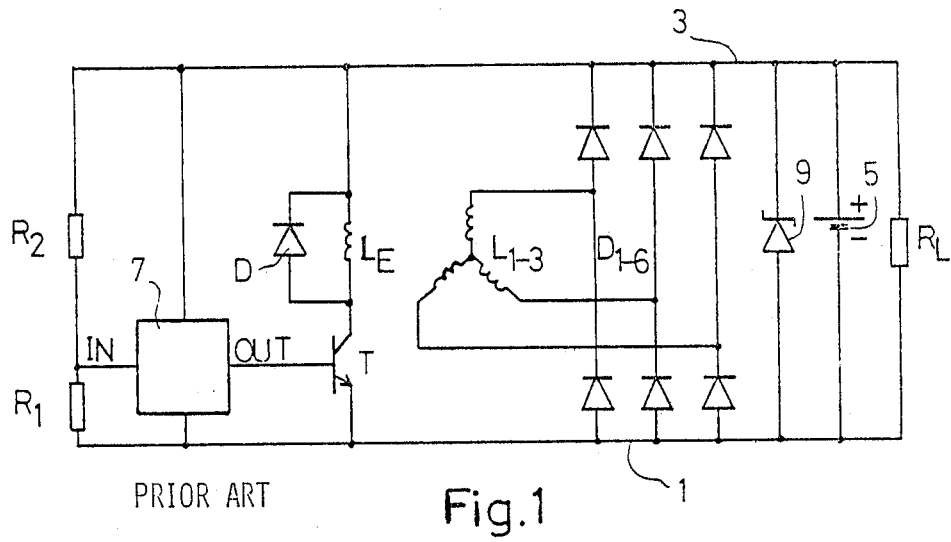
FIG. 1 is a schematic diagram of the electric circuit of a power generator of a known type.

As shown in FIG. 1, the three windings $L_{1-3}$ in the stator of an alternator are connected in the usual manner to six rectifier diodes $D_{1-6}$, so as to define two generator outputs 1 and 3 in which a D.C. voltage develops. In the example shown, terminal 3 is the positive pole and terminal 1 is the negative pole of the generator. The motor vehicle battery 5, which constitutes both the source for the excitation of the alternator and a load for the generator during its operation while it is charged by the energy produced by the latter, is connected to said outputs. The devices which utilize the electric energy from the generator are shown as a whole in the form of a load $R_L$. The excitation winding $L_E$ in the rotor of the alternator is connected on one side to the positive terminal 3 of the generator and on the other to the collector of a transistor T of the NPN type, whose emitter is connected to the negative terminal 1 and whose base is connected to the output OUT of a regulator circuit 7. The regulator circuit 7 is fed by the generator output and has an input IN connected to the intermediate terminal of a voltage divider consisting of two resistors $R_1$ and $R_2$ which are connected between terminals 1 and 3. A back biased diode D which is commonly called return diode, is connected in parallel to winding $L_E$. Regulator 7 is of the type shown and described, for example, in the volume entitled "Electricity in cars" by R. H. Bacon, Philips Technical Library, 1967, p. 49–51, and it operates by supplying current to the base of transistor T according to the value of the output voltage from the generator, sampled through the divider comprising resistors $R_1$ and $R_2$. As long as the output voltage does not exceed a predetermined value, the base current is such that it maintains transistor T in the conducting state, so that a current $I_E$ passes through the excitation winding $L_E$. As soon as such voltage exceeds a predetermined value, the output current from the regulator disappears, so that transistor T is inoperative, the excitation current $I_E$ tends to disappear and the output voltage decreases. The regulating cycle is repeated so that the output voltage is kept practically constant. While transistor T is in the inoperative state, a high voltage, which might damage the transistor, is created by self-induction at the ends of the excitation winding $L_E$. In order to avoid this risk, a diode D is provided, which, being forward biased during the overvoltage, permits a rapid dissipation of the energy stored within winding $L_E$.

In the case of a sudden disconnection of the connection between the alternator and the load, consisting of battery 5 and the various devices $R_L$ utilizing the generated power, or in the case of the detachment of a battery terminal while the battery is being charged, a high-voltage transient begins between alternator outputs 1 and 3, which may reach values over 10 times as high as the battery voltage and ends within a period normally ranging between 100 and 300 msec.

Said transient is basically due to a self-induction phenomenon on the excitation winding $L_E$. Acutally, while transistor T is inoperative, the energy stored in the magnetic field associated with winding $L_E$ is basically dissipated through diode D, according to a time constant determined by the ratio between the inductance L and the resistance R in winding $L_E$. The current which flows through the circuit formed by $L_E$ and D produces an induced electromotive force in stator windings $L_{1-3}$ and therefore a voltage between outputs 1 and 3 which ends according to a time constant determined solely by the excitation winding resistance in the case of the disconnection of the alternator cable or, basically, by the input resistances of the devices still connected to the alternator, in the case of the battery disconnection. In order to prevent such overvoltage from damaging the regulator and the devices connected to the alternator, especially when they are built as integrated circuits, the known technology provides for the use of a Zener diode 9, having a breakdown voltage slightly exceeding that of battery 5, and inserted between the alternator output terminals. Since the Zener diode 9 must be able to dissipate a considerable amount of energy, it must be of a relatively large size, and is therefore relatively expensive. According to another known solution, the size, and therefore the cost, of the Zener diode 9 can be reduced by building the regulator and the other integrated circuit devices with manufacturing which are suitable for high-voltage structures. This solution, however, becomes less convenient as the number of integrated circuit electronic devices powered by the generator increases, because integrated devices capable of withstanding high voltages are rather expensive.

The present invention is based on knowing an expedient, used, for example, in the construction of fast relays, which consists of connecting a Zener diode in series with the usual return diode which is connected in parallel to the relay winding. In this case, the time needed to dissipate the energy stored in the magnetic field associated with the winding is reduced by an extent which depends on the breakdown voltage of the Zener diode.

Figure 2:
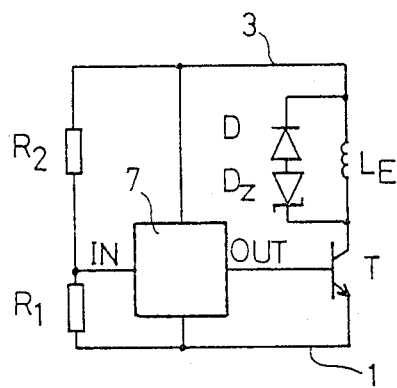
FIGS. 2, 3 and 4 show part of the circuit of a generator of the type shown in FIG. 1 after being modified according to three embodiments of the present invention.

According to the present invention, said expedient is used in the excitation circuit of an alternator as shown in FIG. 2. As a result of the Zener diode $D_z$, which is connected in series to return diode D, the current $I_E$ which flows through the excitation winding $L_E$ during the transient caused by the sudden load reduction will tend to disappear in a shorter time than would be required if only diode D were present. Since the output voltage $E_o$ of the loadless alternator is proportional to current $I_E$ according to the formula: $E_o = KnI_E$, where k is a machine constant and n is the number of revolutions of the alternator rotor, the output transient will be of limited duration and therefore and energy content which can be dissipated without damage even by a low-power Zener 9 diode in parallel to the output. Futhermore, regulator 7 and such other electronic devices as may be powered by the generator may be built following the usual processes for low-voltage structures, and therefore at limited cost.

Figure 3:
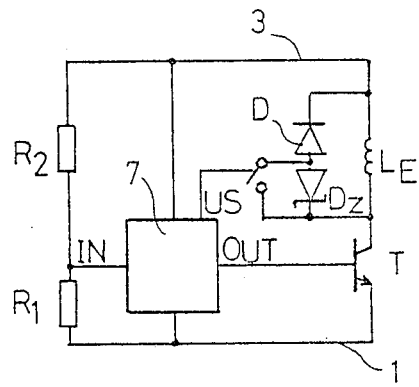

In a practical embodiment of the invention, which provides for the use of a Zener $D_z$ diode having a breakdown voltage approximately equal to twice the battery voltage, the presence of the Zener $D_z$ diode produces no negative effects during the normal operation of the generator. If it were necessary to use a Zener diode with a higher breakdown voltage, however, it is possible that the energy dissipated in the excitation circuit during the regulating periods while transistor T is inoperative might not be negligible. In such case, a variant of the invention, as shown in FIG. 3, provides, in parallel with the Zener $D_z$ diode, for an electronic switch operated by an additional output US of regulator 7, so that it is closed during the normal operation of the generator and to be opened when an overvoltage occurs on the alternator output.

The practical construction of such improvement is within the reach of any specialist in this field, and therefore is not described in detail.

Figure 4:
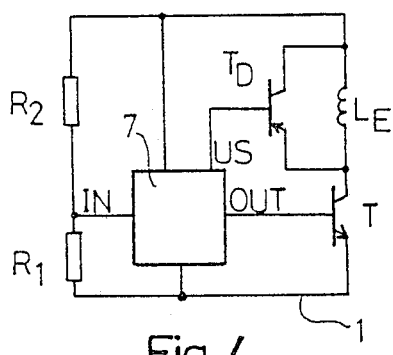

According to another variant of the invention, shown in FIG. 4, the two diodes D and $D_z$ are replaced by a transistor $T_D$ of the PNP type, having the emitter connected to the collector of transistor T and the collector connected to alternator terminal 3. The base of transistor $T_D$ is connected to an additional output US of regulator 7, which, when transistor T is inoperative during normal operation, supplies to the base a polarization voltage which keeps transistor $T_D$ in the conducting state and, when transistor T is inoperative during an output overvoltage, supplies a voltage which produces a predetermined voltage between the collector and the emitter of transistor $T_D$.

The construction of this variant of the invention is also within the reach of a specialist in this field, and therefore is not further illustrated and described.

We claim:

1. An electric power generator for motor vehicles comprising an alternator having rotor windings which are connected to a rectifier circuit having two output terminals which constitute the generator output; said alternator further having an excitation winding which is connected in series with a controlled electronic switch to said output terminals; said generator further comprising an electronic regulator connected to said output terminals and to a terminal which is connected to said electronic switch for controlling said electronic switch, said electronic regulator opening said electronic switch when an output voltage of said generator exceeds a predetermined value; said generator further comprising a protective device means for protecting against voltage transients due to a battery disconnection, said protective device means being connected in parallel to said excitation winding and comprising a semiconductor circuit;

wherein said semiconductor circuit comprises a Zener diode connected in series with a semiconductor diode and wherein said regulator further comprises an additional output terminal having a control signal which appears when said output voltage of said generator exceeds a predetermined alarm level which is higher than said predetermined value and wherein said semiconductor circuit further comprises a normally closed electronic switch connected in parallel with said Zener diode and having its control terminal connected to said additional regulator output so as to control the shorting of said Zener diode in dependence upon said output voltage of said generator.

2. An electric power generator for motor vehicles comprising an alternator having rotor windings which are connected to a rectifier circuit having two output terminals which constitute the generator output; said alternator further having an excitation winding which is connected in series with a controlled electronic switch to said output terminals; said generator further comprising an electronic regulator connected to said output terminals and to a terminal which is connected to said electronic switch for controlling said electronic switch, said electronic regulator opening said electronic switch when an output voltage of said generator exceeds a predetermined value; said generator further comprising a protective device means for protecting against voltage transients due to a battery disconnection, said protective device means being connected in parallel to said excitation winding and comprising a semiconductor circuit;
  wherein said semiconductor circuit comprises a bipolar transistor connected across said excitation winding and wherein said regulator further comprises an additional output terminal upon which a control signal appears when said output voltage of said generator exceeds the predetermined alarm level which is higher than said predetermined value and wherein said additional output terminal is connected to a base of said bipolar transistor so as to control the shorting of said excitation winding in dependence upon said output voltage of said generator.

* * * * *